Figure 1:
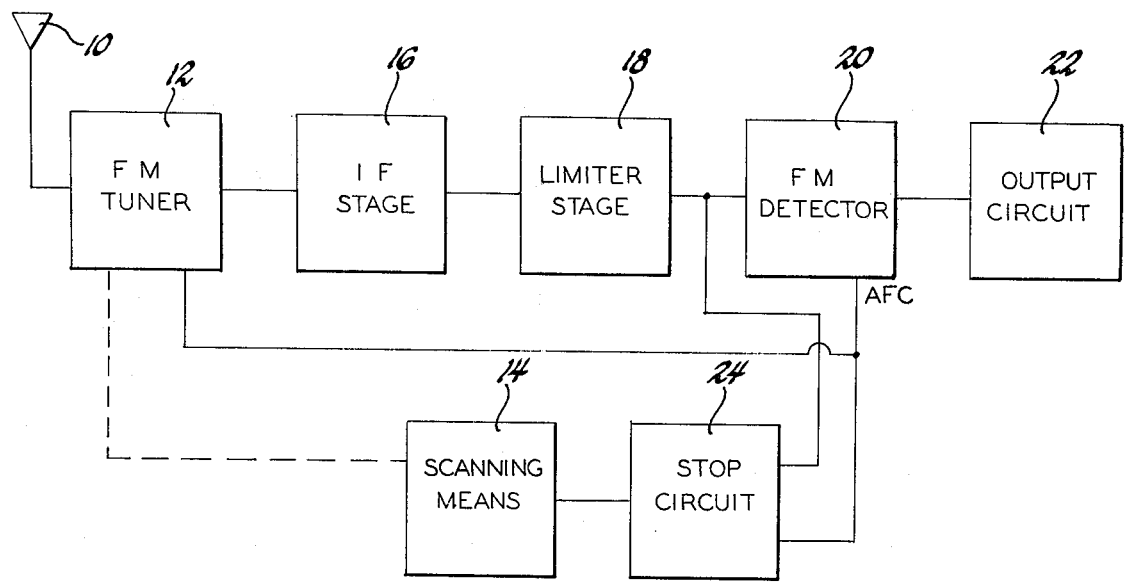

United States Patent [19]

Glennon et al.

[11] 3,947,774
[45] Mar. 30, 1976

[54] SIGNAL SEEKING STOPPING CIRCUIT RECEIVER

[75] Inventors: Timothy P. Glennon; Douglas E. Martin, both of Kokomo, Ind.

[73] Assignee: General Motors Corporation, Detroit, Mich.

[22] Filed: Nov. 25, 1974

[21] Appl. No.: 526,637

[52] U.S. Cl. .............................. 325/470; 325/471
[51] Int. Cl.² ........................................ H04B 1/32
[58] Field of Search ........................... 325/468–471

[56] References Cited
UNITED STATES PATENTS

| | | | |
|---|---|---|---|
| 2,837,646 | 6/1958 | Campbell | 325/470 |
| 3,041,451 | 6/1962 | Laing et al. | 325/470 |
| 3,553,379 | 1/1971 | Boomgaard | 325/470 |

Primary Examiner—Albert J. Mayer
Attorney, Agent, or Firm—Albert F. Duke

[57] ABSTRACT

A circuit for terminating the scanning operation of a signal seeking receiver includes a double-ended limit detector which responds to the AFC voltage developed in the receiver to produce a stop signal when the frequency deviations of the IF signal are within a narrow band centered about 10.7 Mhz.

3 Claims, 2 Drawing Figures

U.S. Patent  March 30, 1976  3,947,774

SIGNAL SEEKING STOPPING CIRCUIT RECEIVER

This invention relates to signal seeking systems for use in radio receivers and more particularly to a signal seeking stopping circuit for FM receivers.

Many radio receivers, particularly those designed for use in automobiles, are equipped with signal seeking tuners in which a motorized signal search device is manually actuated but automatically deactuated upon receipt of a signal of sufficient strength. Signal seeking AM receivers operating on this principle provide reasonably good results. However, in FM receivers the signal strength alone provides an ambiguous tuning criteria due to the three definitely distinguishable maxima of signal response exhibited by the FM detector. Unless the FM receiver is tuned about the center frequency of the IF band pass, distortions in the recovered audio occur. Accordingly, a basic requirement of a signal seeking FM receiver is that the signal seeking or search operation be terminated in a manner to achieve center tuning.

The prior art signal seeking receivers utilize a high Q filter peaked at 10.7 Mhz. responsive to the IF amplifier stage which pass only a narrow band of frequency components centered about the 10.7 Mhz. intermediate frequency in order to stop the signal seeking operation. One of the problems associated with this approach is the difficulty of compensating the filter for temperature variation. Since the 10.7 Mhz. filter must be matched to the center of the IF band pass, temperature variations can result in imprecise termination of the signal seeking operation and resulting mistuning of the receiver.

In accordance with the present invention the automatic frequency control voltage provided by the FM detector for controlling the frequency of the local oscillator is utilized for activating stop circuitry which automatically terminates the signal seeking operation of the receiver. The AFC voltage level is sensed by a double-ended limit detector and associated circuitry which provides a stop signal when the frequency deviations of the IF signal are within a narrow band centered about 10.7 Mhz. Since off-station noise can produce an AFC voltage level which is the same as that produced when the receiver is center tuned, the limit detector is inhibited unless the received signal is within the IF band pass.

Figure 2:
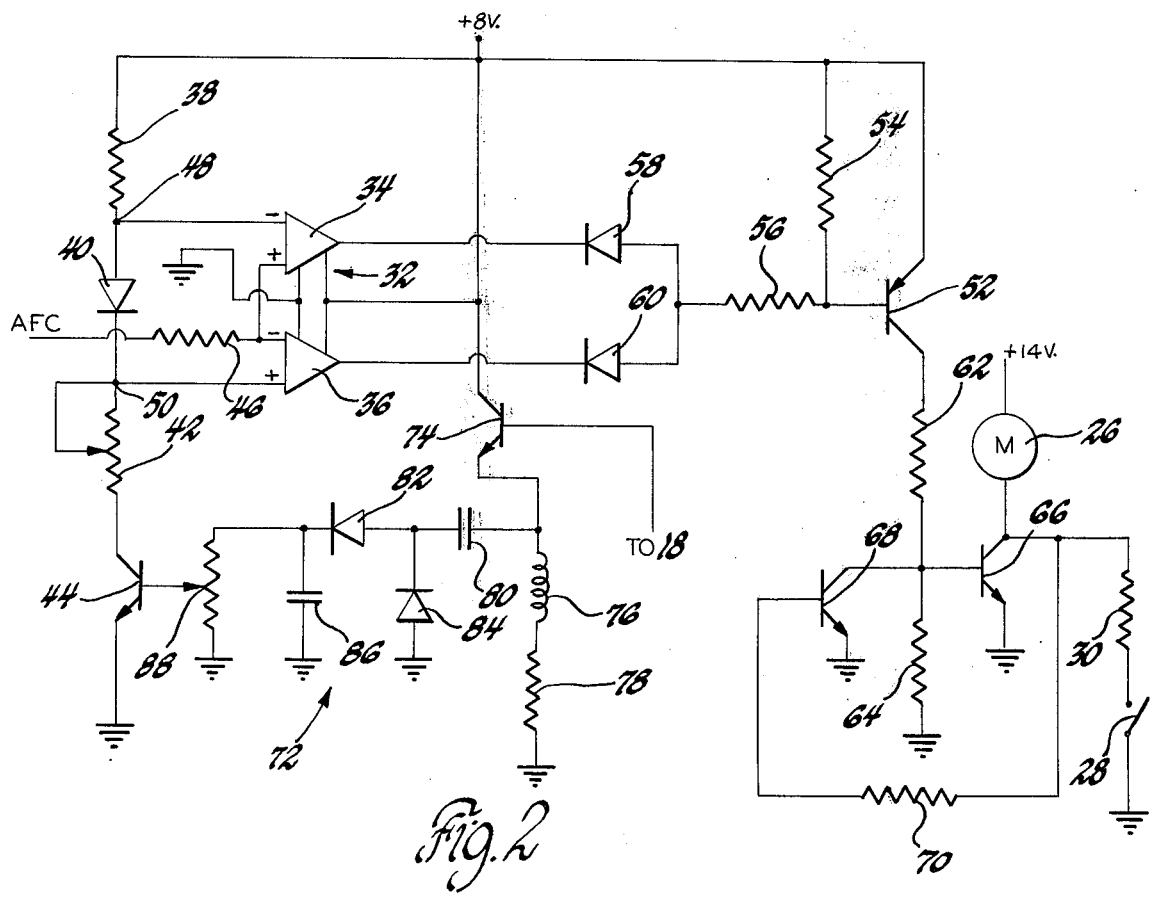

A more complete understanding of the present invention may be had from the following detailed description which should be read in conjunction with the drawings in which:

FIG. 1 is a block diagram of the signal seeking FM receiver of the present invention; and FIG. 2 is a detailed schematic diagram of the stop circuit of FIG. 1.

Referring now to the drawings and initially to FIG. 1, an antenna 10 is disposed for receiving RF signals which are applied to an FM tuner 12 which includes RF amplifying, mixer, and local oscillator stages. Scanning means generally designated 14 are coupled with the tuner 12 for scanning the FM frequency band. The scanning operation causes the tuned frequency of the RF stages and oscillator stages of the tuner 12 to be varied and the incoming signals are heterodyned to an intermediate frequency at the output of the tuner 12. The scanning or signal seeking operation is instigated manually and terminated automatically in a manner hereinafter described. The output of the tuner 12 is applied to an IF amplifier 16 which has a band pass centered about the standard intermediate frequency of 10.7 Mhz. used in FM receivers. A limiter stage 18 is connected with the output of the IF stage 16 for clipping the amplitude of the IF signal at a limiting level to obtain an IF limited signal which is applied to an FM detector 20 which operates to demodulate and retrieve the information transmitted on the incoming carrier signal. The output of a detector 20 is coupled to an output circuit 22 including the usual audio amplifier and speaker circuits. The detector 20 also provides a DC control voltage which varies about a reference voltage corresponding to a frequency of 10.7 Mhz. and serves to automatically control the frequency of the local oscillator in the tuner 12 to insure that the IF signal remains centered within the band pass of the IF amplifier stage 16. For example, the AFC voltage may vary about a nominal DC voltage of 4 volts with a range of 2 volts to 6 volts.

Termination of the signal seeking operation is accomplished by a stop circuit generally designated 24 which responds to the AFC voltage and to the output of the limiter stage 18. Referring now to FIG. 2, the scanning means 14 may, by way of example, include a motor 26 which is mechanically coupled with the tuning means in the FM tuner 12. Rotation of the motor 26 is initiated manually through a control switch 28 which connects the motor 26 across a 14 volt supply through a resistor 30. A relay (not shown) is also energized by closure of the switch 28 and controls a clutch or brake which releases the motor shaft when the relay is energized and brakes the motor shaft when the relay is deenergized. A suitable scanning apparatus is disclosed in the U.S. Pat. to Kearney et al No. 2,775,895 assigned to the assignee of the present invention. The invention is not limited, however, to any particular scanning means but may be effectively utilized in connection with a variety of scanning devices including those which are electronic as opposed to electromechanical as will be appreciated by those skilled in the art.

The stop circuit 24 includes a double-ended limit detector 32 comprising operational amplifiers 34 and 36. A bias network for the limit detector 32 includes a resistor 38, diode 40, and potentiometer 42. The bias network is connected at one end to an 8 volt source and at the other end to ground through a control transistor 44. The inverting input of the amplifier 34 and the non-inverting input of the amplifier 36 are connected to opposite sides of the diode 40. The AFC control voltage from the detector 20 is applied to the non-inverting input of the amplifier 34 and the inverting input of the amplifier 36 through a resistor 46. When the transistor 44 is conducting the diode 40 establishes a 0.2 volt differential between the junctions 48 and 50. The potentiometer 42 may be adjusted to shift the 0.2 volt window to accommodate changes in the center tuned AFC voltage in different receivers. For example, if the AFC voltage varies from a minimum of 2 volts to a maximum of 6 volts with a nominal value of 4 volts when the receiver is center tuned, the potentiometer 42 may be set to establish a voltage of 4.1 volts at the junction 48 which results in a voltage of 3.9 volts being established at the junction 50. The 0.2 volt differential between the junctions 42 and 50 correspond to a frequency deviation of, for example, 50 Khz. so that the AFC voltage will fall within the window of the detector 32 when the IF signal is 25 Khz. on either side of 10.7

Mhz. When the AFC voltage is above the upper limit of the 0.2 volt window, the output of the amplifier 34 is low and the output of the amplifier 36 is high. Conversely, when the AFC voltage is below the lower window limit, the output of the amplifier 36 is low and the output of the amplifier 34 is high. When the AFC voltage is between the upper and lower window limits, the outputs of both amplifier 34 and amplifier 36 are high.

A transistor 52 is controlled by the level detector 32. If the output of either the amplifier 34 or 36 is low, current flows through resistors 54, 56 and the appropriate one of the diodes 58 or 60 to bias the transistor 52 to saturation. When a station is detected, the diodes 58 and 60 are back-biased and transistor 52 is cut off. The collector of transistor 52 is connected to ground through resistors 62 and 64.

A latch comprising transistor 66, 68 and resistor 70 is released in response to closure of the switch 28 and latched when the receiver is center tuned.

When the receiver is off-channel, the AFC voltage is the same as that developed when the receiver is center tuned. Accordingly, AFC voltage alone is an ambiguous indication of center tuning. Accordingly, the limit detector is maintained in a state which permits the motor 26 to continue scanning the frequency band until a signal is present in the IF amplifier 16. This accomplished by a peak detector generally designated 72 which controls transistor 44. When transistor 44 is non-conductive the 0.2 volt window is shifted toward the 8 volt source so that the AFC voltage is always below the lower limit and the output of the amplifier 36 is low. This maintains the transistor 52 in a conducting state which permits the motor 26 to continue operating. The peak detector 72 includes an emitter-follower transistor 74 having its base connected with the limiter stage 18. The collector of transistor 74 is connected with the 8 volt supply while the emitter is connected through a choke 76 and a resistor 78 to ground. The choke 76 causes high AC swing-out of the transistor 74 and the DC level is blocked by a capacitor 80. The resulting AC signal is rectified by a voltage doubler consisting of diodes 82 and 84 and filtered by a capacitor 86. The resulting DC level is applied to the base of transistor 44 through a sensitivity potentiometer 88 and may be adjusted to cause the transistor 44 to be conductive as a function of the signal strength of the received signal.

The operation of the stop circuit 24 is as follows. Assuming that the receiver is center tuned to a signal of sufficient strength, the transistor 44 will be conducting and the outputs of the amplifiers 34 and 36 will be high and the transistor 52 will be cut off. Closure of the switch 28 energizes the motor 26 which detunes the receiver causing the output of one of the amplifiers 34 or 36 to go low which renders the transistor 52 conductive which in turn supplies base drive to the transistor 66 maintaining the motor 26 energized after the switch 28 is opened. As the receiver moves off-channel, the transistor 44 is turned off and the output of the amplifier 36 remains low regardless of the AFC voltage. If a signal is now received of sufficient strength to render the transistor 44 conductive and the receiver is tuned within a 50 Khz. bandwidth centered about the center tuned frequency, both outputs of the amplifiers 34 and 36 will be driven high turning the transistor 52 off and removing base drive from the transistor 66 and the motor 26 stops. With the transistor 66 cut off its collector voltage approaches 14 volts supplying base drive to the transistor 68. If, because of loss of signal or any other reason, transistor 52 is turned on, the motor 26 cannot be started because the collector current from transistor 52 is diverted from the base of transistor 66 to the transistor 68. Accordingly, once stopped, the motor 26 cannot be restarted until the switch 28 is closed.

Having thus described our invention, what we claim is:

1. In a frequency modulated receiver including tuning means, IF amplifying means, and detector means for developing a DC voltage representing the frequency of the IF carrier signal for automatic frequency control, the combination of means for scanning the frequency band of said receiver said scanning means coupled to said tuning means, means for initiating a scanning of said frequency band, means responsive to the output of said IF amplifier means during said scanning for developing a first control signal when the amplitude of the output reaches a predetermined threshold, means responsive to said DC voltage for developing a second control signal when said DC voltage is within upper and lower voltage limits on either side respectively of a voltage corresponding to the center frequency of the band pass of said IF amplifying means, and means responsive to the coincidence of said first control signal and said second control signal for terminating the scanning of said frequency band.

2. In a frequency modulated receiver including tuning means, IF amplifying means, and means responsive to the output of said IF amplifying means for producing a DC voltage representing the frequency of the IF carrier signal for automatic frequency control, the combination of, means for scanning the frequency band of said receiver, means for initiating the scanning of said frequency band, voltage comparator means responsive to said DC voltage for developing a controlled output when said DC voltage is between predetermined upper and lower voltage levels, bias control means for biasing said comparator means for establishing said upper and lower voltage levels, said bias control means responsive to the output of said IF amplifying means to establish said upper and lower voltage levels within the deviation range of said DC voltage when the strength of the IF signal reaches a predetermined threshold and establishing said upper and lower voltage levels beyond one of the deviation limits of said DC control voltage when the strength of the IF signal is below said predetermined threshold, and means for terminating the scanning of said frequency band in response to said control output of said voltage comparator means.

3. A stop circuit for a signal seeking FM receiver including means for scanning the frequency band of said receiver, means for initiating the scanning of said frequency band, intermediate frequency amplifying means, and detecting means for developing a DC voltage representing the frequency of the IF carrier signal, said stop circuit comprising double-ended limit detector means including first and second operational amplifiers each having inverting and non-inverting inputs, means applying said DC voltage to the non-inverting input of said first operational amplifier and the inverting input of said second operational amplifier, biasing means including a diode connected between the inverting input of said first operational amplifier and the non-inverting input of said second operational amplifier, said bias control means further including a transistor switch, means responsive to the output of said IF amplifying means for rendering said transistor switch conductive when the strength of the IF signal reaches a predetermined threshold, second transistor switch means responsive to the output of said limit detector means for developing a control signal for terminating the scanning of said frequency band when said DC voltage is between the upper and lower limits established by said bias control.

* * * * *